United States Patent
Francis et al.

(10) Patent No.: US 7,696,598 B2
(45) Date of Patent: Apr. 13, 2010

(54) ULTRAFAST RECOVERY DIODE

(75) Inventors: Richard Francis, Los Gatos, CA (US); Jian Li, Sunnyvale, CA (US); Yang Yu Fan, Sunnyvale, CA (US); Eric Johnson, Santa Clara, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 0 days.

(21) Appl. No.: 11/320,313

(22) Filed: Dec. 27, 2005

(65) Prior Publication Data

US 2007/0145414 A1   Jun. 28, 2007

(51) Int. Cl.
*H01L 29/47* (2006.01)
(52) U.S. Cl. ............................. 257/471; 257/E29.148
(58) Field of Classification Search ......... 257/471–486, 257/E29.148, E29.149
See application file for complete search history.

(56) References Cited

U.S. PATENT DOCUMENTS

| | | | | |
|---|---|---|---|---|
| 4,871,686 A * | 10/1989 | Davies | ........................ | 438/328 |
| 4,972,237 A * | 11/1990 | Kawai | ........................ | 257/270 |
| 4,982,260 A | 1/1991 | Chang et al. | ................... | 357/38 |
| 5,612,567 A * | 3/1997 | Baliga | ......................... | 257/475 |
| 6,252,288 B1 | 6/2001 | Chang | ......................... | 257/471 |
| 6,734,461 B1 * | 5/2004 | Shiomi et al. | .................. | 257/77 |
| 2002/0125541 A1* | 9/2002 | Korec et al. | ................... | 257/471 |
| 2005/0230745 A1* | 10/2005 | Fatemizadeh et al. | ....... | 257/330 |
| 2005/0242411 A1* | 11/2005 | Tso | ............................ | 257/480 |

FOREIGN PATENT DOCUMENTS

| | | | |
|---|---|---|---|
| EP | 0975024 A2 | * | 1/2000 |
| JP | 2003-142698 | * | 5/2003 |

OTHER PUBLICATIONS

Baliga, B.J., "Analysis of a High Voltage Merged PIN/Schottky (MPS) Rectifier," IEEE Electron Device Letters, vol. EDL-5, 1987, pp. 407-409.
Baliga, B.J., "Power Semiconductor Devices—Chapter 4," PWS Publishing Company, 1996.
Gupta, R.N., et al., A Planarized High Voltage Silicon Trench Sidewall Oxide-Merged PIN/Schottky (TSOX-MPS) Rectified, IEEE, IEDM, 1999.
Yano, K., et al., "High Voltage Rectifier Using the BSIT Operation," IEEE Transactions on Electron Devices, vol. 45, No. 2, Feb. 1988.
International Search Report for International Application No. PCT/US2006/049118, mailed Jul. 4, 2007.
Irokawa, Y., et al., "Si+ ion implanted MPS bulk GaN diodes," Solid-State Electronics, vol. 48, 2004, pp. 827-830.

* cited by examiner

*Primary Examiner*—Sue Purvis
*Assistant Examiner*—Kevin Quinto
(74) *Attorney, Agent, or Firm*—Morgan, Lewis & Bockius LLP

(57) ABSTRACT

An ultrafast recovery diode. In a first embodiment, a rectifier device comprises a substrate of a first polarity, a lightly doped layer of the first polarity coupled to the substrate and a metallization layer disposed with the lightly doped layer. The ultrafast recovery diode includes a plurality of wells, separated from one another, formed in the lightly doped layer, comprising doping of a second polarity. The plurality of wells connect to the metallization layer. The ultrafast recovery diode further includes a plurality of regions, located between wells of said plurality of wells, more highly doped of the first polarity than the lightly doped layer.

10 Claims, 3 Drawing Sheets

ULTRAFAST RECOVERY DIODE

RELATED APPLICATION

This Application is related to co-pending, commonly owned U.S. patent application Ser. No. 10/869,718, entitled "Schottky Barrier Rectifier and Method of Manufacturing the Same," filed Jun. 15, 2004, which is hereby incorporated by reference herein in its entirety.

BACKGROUND OF THE INVENTION

An important factor in the efficiency of a switching power supply is the performance of the diodes used in such circuits. More particularly, the reverse recovery of such diodes can reduce turn-on loss of the transistor switch in such power supplies. For example, a reverse recovery current transient appears as an additional component of current during the turn-on of the switch, with the result that the turn-on loss of the switch is significantly higher that it would otherwise be without such reverse recovery component. Consequently, reducing metal oxide semiconductor field effect transistor (MOSFET) body diode reverse recovery charge (Qrr) and/or reducing reverse recovery time (trr) is important for improving the efficiency of switching power supplies.

Unfortunately, however, if the reverse recovery is too abrupt, then the current and voltage will experience undesirable oscillations. Such oscillations can result in, for example, low efficiency power supply operation, a deleteriously noisy output, e.g., power supply ripple and/or electromagnetic interference, and/or extremely high and possibly damaging voltage spikes.

SUMMARY OF THE INVENTION

Thus, a fast recovery diode with reduced reverse recovery charge that maintains a soft recovery characteristic is highly desired. A further desire exists to meet the previously identified desire in an ultrafast recovery diode that can be formed in either trench or planar versions. Yet another desire exists to meet the previously identified desires in a manner that is compatible and complimentary with convention semiconductor manufacturing processes and equipment.

Accordingly, an ultrafast recovery diode is disclosed. In a first embodiment, a rectifier device comprises a substrate of a first polarity, a lightly doped layer of the first polarity coupled to the substrate and a metallization layer disposed with the lightly doped layer. The ultrafast recovery diode includes a plurality of wells, separated from one another, formed in the lightly doped layer, comprising doping of a second polarity. The plurality of wells connects to the metallization layer. The ultrafast recovery diode further includes a plurality of regions, located between wells of said plurality of wells, more highly doped of the first polarity than the lightly doped layer.

In accordance with another embodiment of the present invention, a semiconductor device comprises a rectifier, wherein the rectifier comprises a plurality of P-type wells coupled to a contactable metal layer. The plurality of P-type wells injects holes into a channel region between the plurality of P-type wells in a forward-bias condition of the rectifier. The plurality of P-type wells pinch off the channel region in a reverse-bias condition of the rectifier. The semiconductor device further includes a plurality of N-type wells located between the plurality of P-type wells. The plurality of N-type wells suppresses minority carrier injection from the plurality of P-type wells.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well-known methods, procedures, components, and circuits have not been described in detail as not to unnecessarily obscure aspects of the present invention.

Figure 1:
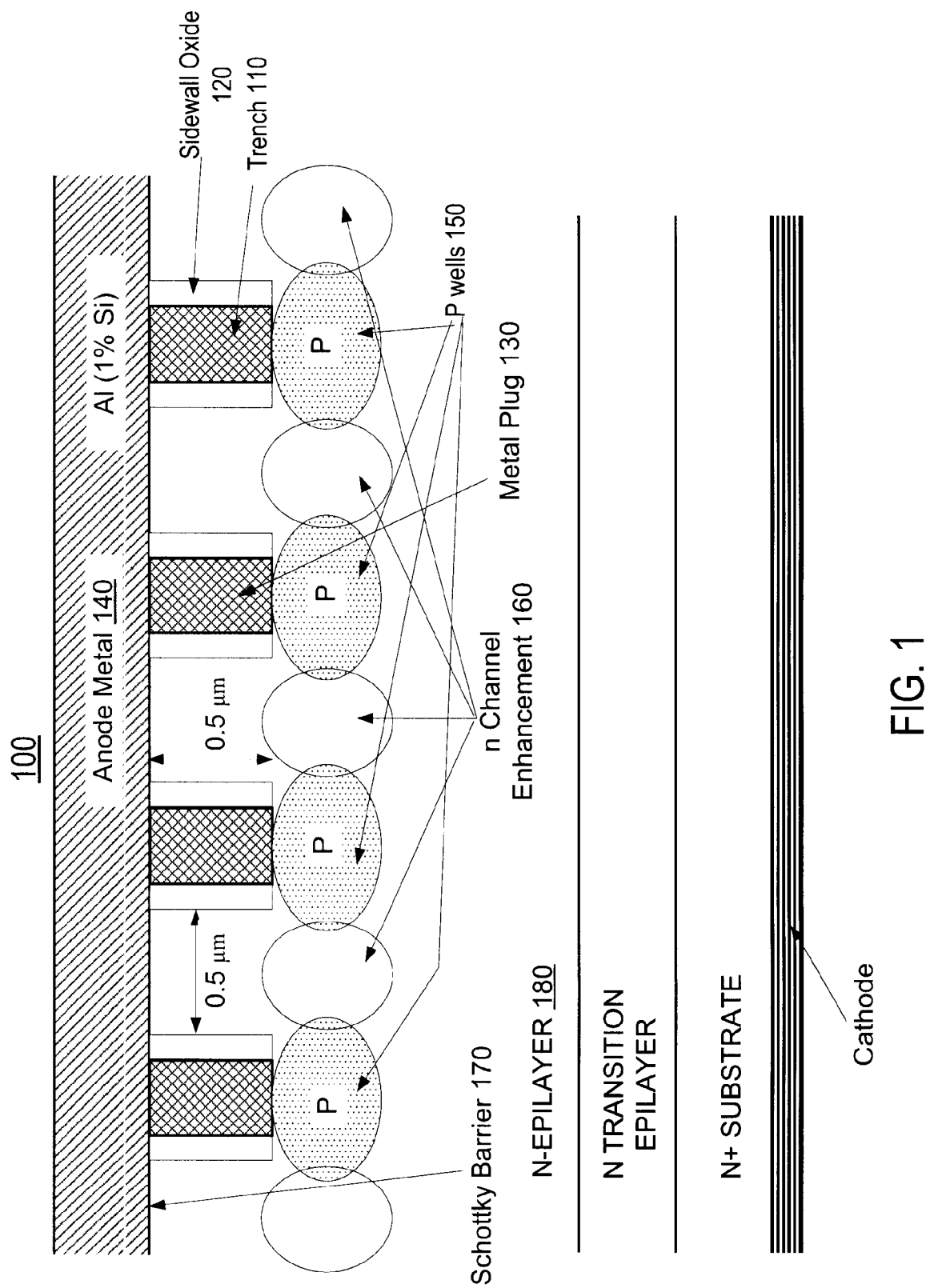
FIG. 1 illustrates a side sectional view of an ultrafast recovery diode, in accordance with embodiments of the present invention.

FIG. 1 illustrates a side sectional view of an ultrafast recovery diode 100, in accordance with embodiments of the present invention. Diode 100 is formed in an N-epitaxial layer 180. Diode 100 comprises a plurality of trenches 110 with oxide sidewalls 120. A conductive 130 plug, e.g., comprising Tungsten or Polysilicon, fills trenches 110, coupling anode metallization 140, e.g., an anode contact, with p wells 150. P well regions 150 underlie trenches 110. P well regions 150 are designed to act as weak anodes. Anode 140 typically comprises Aluminum, and may further comprise about one percent Silicon in some embodiments.

The trenches 110 of diode 100 have exemplary depth dimensions of about 0.3 to 0.7 microns. The trenches 110 of diode 100 have exemplary width dimensions of about 0.3 to 0.6 microns. The trenches 110 have an exemplary pitch of about 0.6 to 1.3 microns. It is appreciated that embodiments in accordance with the present invention are well suited to other dimensions.

In accordance with embodiments of the present invention, regions between p wells 150 comprise n-type doping, referred to as "n channel enhancement" 160. N channel enhancement 160 comprises exemplary doping of about $1.0 \times 10^{15}$ to $2.0 \times 10^{16}$ atoms per cubic centimeter. It is to be appreciated that such a doping level is generally above a doping level N-epitaxial layer 180. Schottky barrier 170 is formed between the anode metal 140 and the N-epitaxial layer 180. Schottky barrier 170 may be formed, for example, by inherent characteristics of Aluminum disposed adjacent to an N-epitaxial layer, e.g., anode metal 140 comprising Aluminum disposed adjacent to N-epitaxial layer 180. Embodiments in accordance with the present invention are well suited to other formations of Schottky barrier 170.

It is appreciated that, under reverse bias conditions, Schottky diodes generally tend to leak. However, in accordance with embodiments of the present invention, under reverse bias the p-wells 150 pinch off, e.g., a depletion region forms between the P-wells 150, ensuring a desirable breakdown voltage and low leakage for diode 100. Advantageously, the n channel characteristics of diode 100 result in improved reverse recovery. One mechanism for such improved reverse recovery is believed to be a suppression of minority carrier injection from the p wells 150.

Figure 2:
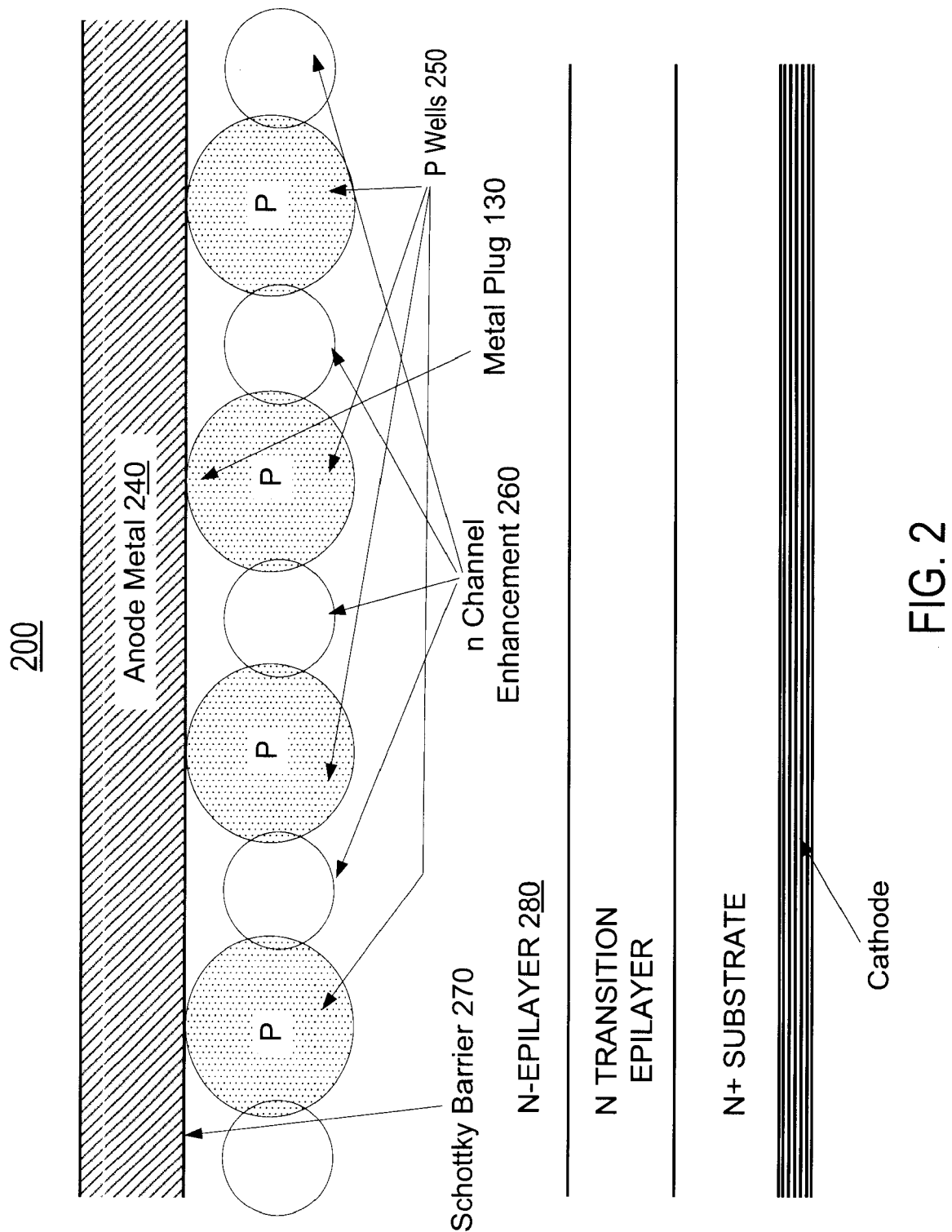
FIG. 2 illustrates a side sectional view of an ultrafast recovery diode, in accordance with alternate embodiments of the present invention.

FIG. 2 illustrates a side sectional view of an ultrafast recovery diode 200, in accordance with embodiments of the present invention. Diode 200 is formed in an N-epitaxial layer 280. Diode 200 comprises a plurality of P well regions 250. It is to be appreciated that P well regions 150 contact anode metallization 240. P well regions 250 are designed to act as weak anodes. P well regions 250 may be, for example, constructed at a pitch similar to that of trenches 110 (FIG. 1), e.g., a pitch of about 0.6 to 1.3 microns. Anode 240 typically comprises Aluminum, and may further comprise about one percent Silicon in some embodiments.

In accordance with embodiments of the present invention, regions between p wells 250 comprise n-type doping, referred to as "n channel enhancement" 260. N channel enhancement 260 comprises exemplary doping of about $1.0 \times 10^{15}$ to $2.0 \times 10^{16}$ atoms per cubic centimeter. It is to be appreciated that such a doping level is generally above a doping level of N-epitaxial layer 280. Schottky barrier 270 is formed between the anode metal 240 and the N-epitaxial layer 280. Schottky barrier 270 may be formed, for example, by inherent characteristics of Aluminum disposed adjacent to an N-epitaxial layer, e.g., anode metal 240 comprising Aluminum disposed adjacent to N-epitaxial layer 280. Embodiments in accordance with the present invention are well suited to other formations of Schottky barrier 270.

In a manner similar to that of diode 100 described previously with respect to FIG. 1, in accordance with embodiments of the present invention, under reverse bias conditions the p-wells 250 pinch off, e.g., a depletion region forms between the P-wells 250, ensuring a desirable breakdown voltage and low leakage for diode 200. Advantageously, the n channel characteristics of diode 200 result in improved reverse recovery. One mechanism for such improved reverse recovery is believed to be a suppression of minority carrier injection from the p wells 250.

Diodes 100 and 200 may be understood as comprising a Schottky diode in series with a junction field effect transistor (JFET) channel and the base region of a P intrinsic N (PiN) diode. The PiN diode is conductively modulated by the injection of minority carriers from the gate of the JFET. Diodes 100 and 200 should be constructed utilizing relatively fine process geometries as it is desirable to increase the ratio of Schottky barrier area to PiN area to greater than one. In addition, construction in a fine process geometry renders doping of p wells disposed beneath a trench, e.g., p wells 150 (FIG. 1), significantly easier in comparison to doping of p wells beneath larger trenches corresponding to larger process geometries.

Diodes 100 (FIG. 1) and 200 (FIG. 2) are now described functionally. A JFET channel forms between the plurality of P-wells. In a forward bias condition, the P wells inject holes into the JFET channel. These additional holes reduce the resistance of the JFET channel, enhancing the forward conduction in the Schottky region of the rectifier. A Schottky diode between metal and N-epitaxy is characterized as having a lower forward drop of about 0.3 volts in comparison with PN diode. When a voltage drop across the JFET channel reaches approximately 0.6 volts, the P-wells starts to inject holes. The N channel enhancement regions reduce resistance in the JFET channel thereby delaying onset of a forward bias condition of the p wells. In such a case, a majority of current flows through the JFET channel. Fewer minority carriers results in a decreased density of minority carriers producing beneficial improvements in reverse recovery device performance.

In a reverse bias condition, a depletion region forms around the P-wells. Eventually, these depletion regions overlap one another, resulting in "pinch off" of the JFET channel.

Advantageously, characteristics of embodiments in accordance with the present invention are, in large part, controlled by device geometry rather than doping processes. In general, doping processes produce a varying distribution of dopant density, whereas geometric processes are generally more precise.

It is to be appreciated that embodiments in accordance with the present invention are well suited to performance adjustment via a variety of well known techniques, including, for example, minority carrier lifetime reduction, e.g., including electron irradiation, Argon, Helium or Hydrogen implantation, or the diffusion of a heavy metal, for example Platinum or Gold, singly or in a variety of combinations.

Figure 3:
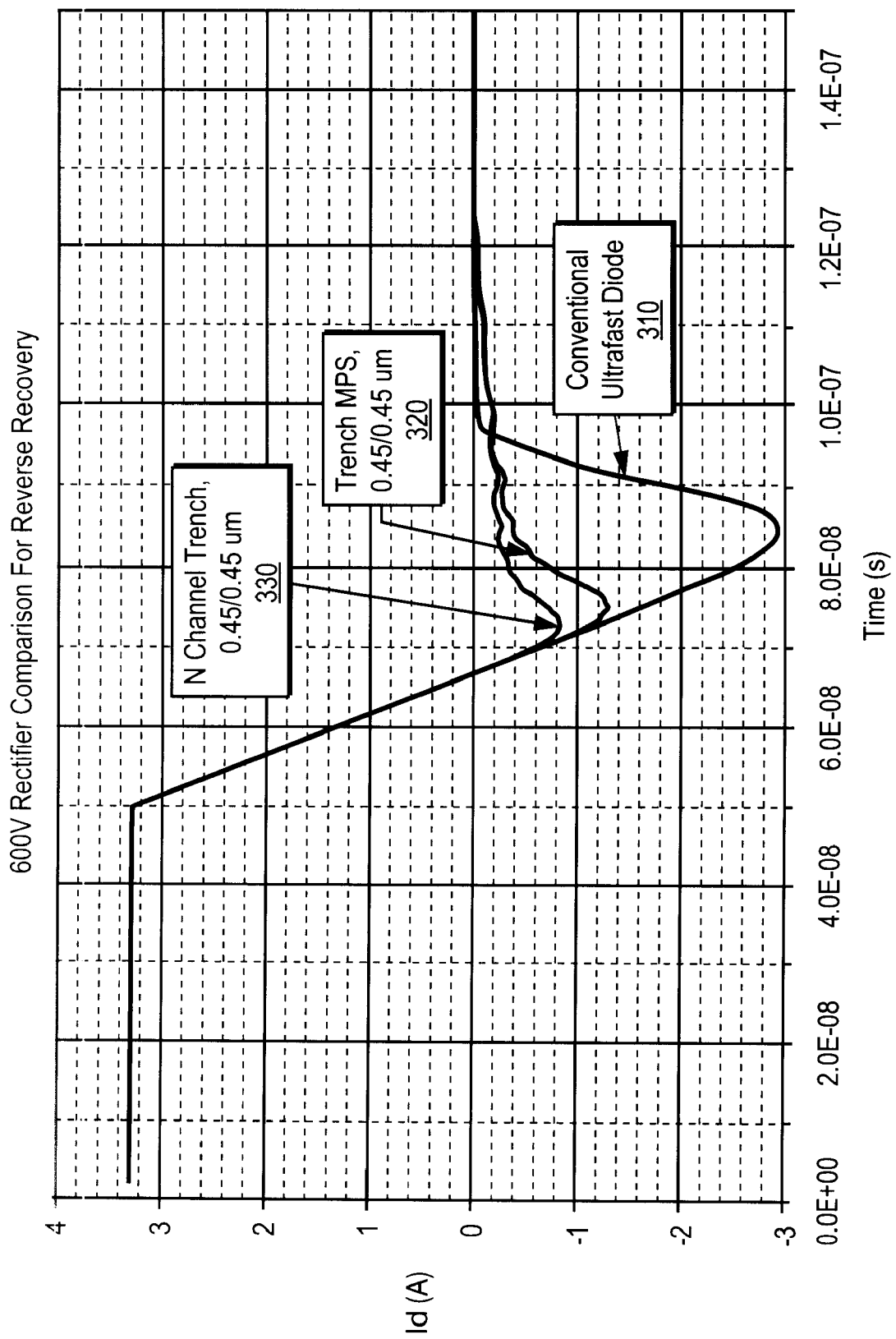
FIG. 3 illustrates exemplary current versus time recovery characteristics, in accordance with embodiments of the present invention.

FIG. 3 illustrates exemplary current versus time recovery characteristics 300, in accordance with embodiments of the present invention. Recovery characteristic 310 represents reverse recovery characteristics of an exemplary 600 volt ultrafast diode as known in the conventional art. It is appreciated that the recovery characteristic comprises about three amperes of maximum reverse current and a duration of about $3 \times 10^{-8}$ seconds.

Recovery characteristic 320 represents reverse recovery characteristics of an exemplary 600 volt diode, in accordance with embodiments of the present invention. It is to be appreciated that the recovery characteristic of this diode comprises significantly less current than the conventional diode of characteristic 310. Recovery characteristic 320 shows a maximum reverse current of about 1.3 amps. Beneficially, the recovery duration is somewhat longer in duration than that of characteristic 310, e.g., about $4.5 \times 10^{-8}$ seconds.

Recovery characteristic 330 represents reverse recovery characteristics of a second exemplary 600 volt diode, in accordance with embodiments of the present invention. It is to be appreciated that the recovery characteristic of this diode comprises significantly less current than the conventional diode of characteristic 310. Recovery characteristic 320 shows a maximum reverse current of about 0.8 amps. Beneficially, the recovery duration is somewhat longer in duration than that of characteristic 310, e.g., about $4.5 \times 10^{-8}$ seconds.

It is to be appreciated that embodiments of the present invention are well suited to construction utilizing materials of opposite polarity to those depicted herein. Such alternative embodiments are to be considered within the scope of the present invention.

Embodiments in accordance with the present invention provide an ultrafast recovery diode with reduced reverse recovery charge that maintains a soft recovery characteristic. Further embodiments in accordance with the present invention provide previously identified features in an ultrafast recovery diode that can be formed in either trench or planer versions. Still other embodiments in accordance with the present invention provide the previously identified features in a manner that is compatible and complimentary with conventional semiconductor manufacturing processes and equipment.

Embodiments in accordance with the present invention, ultrafast recovery diode, are thus described. While the present invention has been described in particular embodiments, it should be appreciated that the present invention should not be construed as limited by such embodiments, but rather construed according to the below claims.

What is claimed is:

1. A rectifier device comprising:
   a substrate of a first polarity;
   a lightly doped layer of said first polarity coupled to the first surface of said substrate;
   a metallization layer disposed on said lightly doped layer as an anode of the rectifier device;
   a metal contact disposed on the substrate as a cathode of the rectifier device;
   a plurality of trenches recessed vertically into said lightly doped layer, wherein each of said plurality of trenches is filled with a conductive material;
   a plurality of wells, separated from one another, formed beneath and adjacent to said plurality of trenches, comprising doping of a second polarity, wherein said plurality of wells are electrically coupled to said metallization layer via said conductive material in said plurality of trenches; and
   a plurality of JFET channel regions, separated from said metallization layer by at least a portion of said lightly doped layer and located between wells of said plurality of wells, more highly doped of said first polarity than said lightly doped layer, wherein the plurality of JFET channel regions have approximately the same vertical dimension as the plurality of wells and the plurality of JFET channel regions are configured to form a plurality of vertical current flow channels between the metallization layer and the substrate.

2. The rectifier device of claim 1 further comprising a layer of oxide forming oxide sidewalls on each of said plurality of trenches.

3. The rectifier device of claim 1 wherein said first polarity is negative (n type).

4. The rectifier device of claim 1 wherein said lightly doped layer is an epitaxial layer.

5. The rectifier device of claim 1 wherein a pitch between said plurality of trenches is less than about 1.0 microns.

6. The rectifier device of claim 1 wherein a depth of said plurality of trenches is less than about 0.9 microns.

7. The rectifier device of claim 1 wherein said metallization layer comprises aluminum.

8. The rectifier device of claim 7 wherein said metallization layer comprises silicon.

9. The rectifier device of claim 1 further comprising a Schottky barrier between said metallization layer and said lightly doped layer.

10. The rectifier device of claim 9 further comprising a PiN area and wherein a ratio of area of said Schottky barrier to said PiN area is greater than 1.0.

* * * * *